US 6,543,668 B1

(12) United States Patent
Fujii et al.

(10) Patent No.: US 6,543,668 B1
(45) Date of Patent: Apr. 8, 2003

(54) MOUNTING METHOD AND MOUNTING APPARATUS FOR ELECTRONIC PART

(75) Inventors: Tomonori Fujii, Haruna-machi (JP); Kazutaka Suzuki, Takasaki (JP)

(73) Assignee: Taiyo Yuden Co., Ltd., Gunma (JP)

( * ) Notice: Subject to any disclaimer, the term of this patent is extended or adjusted under 35 U.S.C. 154(b) by 0 days.

(21) Appl. No.: 09/287,639

(22) Filed: Apr. 7, 1999

(30) Foreign Application Priority Data

Apr. 9, 1998 (JP) ............................................. 10-097335

(51) Int. Cl.[7] ............................................... B23K 31/02
(52) U.S. Cl. ................ 228/103; 228/110.1; 228/180.22
(58) Field of Search ............................... 228/102, 103, 228/105, 110.1, 234.1, 1.1, 8, 12, 10, 9, 180.22; 156/73.1

(56) References Cited

U.S. PATENT DOCUMENTS

| | | | | |
|---|---|---|---|---|
| 3,596,050 A | * | 7/1971 | Tikijian | 228/10 |
| 4,941,256 A | * | 7/1990 | Capson et al. | 29/833 |
| 4,998,664 A | * | 3/1991 | Gibson et al. | 228/102 |
| 5,011,061 A | * | 4/1991 | Funatsu | 228/1.1 |
| 5,176,140 A | * | 1/1993 | Kami et al. | |
| 5,199,630 A | * | 4/1993 | Felber et al. | 228/102 |
| 5,323,952 A | * | 6/1994 | Kato et al. | |
| 5,431,324 A | * | 7/1995 | Kajiwara et al. | 228/102 |
| 5,446,261 A | * | 8/1995 | Hernandez et al. | 219/230 |
| 5,489,758 A | * | 2/1996 | Nihei et al. | 219/121.63 |
| 5,984,165 A | * | 11/1999 | Inoue et al. | 228/180.22 |
| 5,992,729 A | * | 11/1999 | Koopman et al. | |
| 6,202,915 B1 | * | 3/2001 | Sato | |

* cited by examiner

Primary Examiner—Tom Dunn
Assistant Examiner—Jonathan Johnson
(74) Attorney, Agent, or Firm—Townsend & Banta

(57) ABSTRACT

A mounting method and a mounting apparatus of an electronic part onto a substrate are provided, which enable inspection of a bond formed between an electronic part and a substrate when flip-chip bonding is executed by an ultrasonic wave and thermocompression bonding connecting method. The semiconductor chip has bumps which, when are compressed and subjected to ultrasonic vibration, enable formation of a connection between the semiconductor chip and a substrate conductor. The mounting apparatus is constructed so that the amount of compression of the bumps (sinking amounts of bumps) when a predetermined weight R and an ultrasonic vibration US are applied to the bumps for a predetermined time are monitored by the laser displacement meter, a judgment is made as to whether or not the sinking amounts respectively fall within desired ranges, and then a judgment is made as to whether the joint formed by the ultrasonic wave and thermocompression bonding connection utilizing the flip-chip bonding system is defective or non-defective.

2 Claims, 12 Drawing Sheets

MOUNTING METHOD AND MOUNTING APPARATUS FOR ELECTRONIC PART

FIELD OF THE INVENTION

The present invention relates to a method of and apparatus for mounting an electronic part to a substrate conductor, in particular, to a method and apparatus for mounting an electronic part to a substrate which enables inspection of the bonding junction (made by flip-chip bonding) between the electronic part and the substrate conductor.

BACKGROUND OF THE INVENTION

Conventionally, as a high-density mounting method of a semiconductor chip to a substrate conductor, a flip-chip bonding system has been utilized. Such a flip-chip bonding system works by forming a bump (either a soldered bump or metal bump) on an electrode of a semiconductor chip or an electrode of a substrate conductor, and joining the electrode of the semiconductor chip to the countered electrode of the substrate conductor via the bump, with the electrode of the semiconductor chip facing down.

Since in the flip-chip bonding system the electrode can be taken out from an arbitrary position of the surface of the chip, the connection with the substrate conductor by the shortest distance is possible. In addition, the size of the chip does not increase even if the number of electrodes increases, and super-thin mounting can be performed.

A soldering reflow method, an anisotropic conductive resin connecting method, a thermocompression bonding method, an ultrasonic wave, and the like, can be used to join the semiconductor chip or the bump provided on the electrode of the substrate conductor to the mated electrode in the flip-chip bonding method.

According to the ultrasonic wave and thermocompression bonding method mentioned above, and as shown in the conventional apparatus of FIG. 12, in a mounting apparatus 10 of a semiconductor chip 3 as an electronic part comprising an ultrasonic vibration generating device 8, a horn 7, a collet tool 6, a substrate conductor heating unit 4, and a control unit 9, and executes the ultrasonic wave and thermocompression bonding connection utilizing the flip-chip bonding system. In this bonding process, a substrate conductor 1 is heated by the substrate conductor heating unit 4, and an ultrasonic vibration is applied to the collet tool 6 on the side of the semiconductor chip 3 by the piezoelectric element 8 or the like via the horn 7, so that bumps 5 formed on the semiconductor chip 3 diffusively join to electrodes 2 of the substrate conductor 1.

In comparison with other methods, this ultrasonic wave and thermocompression bonding method has advantages such that a joint material is not required, the connection can be made in a short time, and the bonding can be performed at a comparatively low temperature.

However, when using the above-mentioned conventional ultrasonic wave and thermocompression bonding connection methods utilizing the flip-chip bonding system, propagation of an ultrasonic vibration is unstable, causing a danger of formation of defective connections. Such problems may be also caused by slippage between a rear surface (upper surface in the drawing) of the semiconductor chip 3 and the collet tool 6, diffusion of a vibration from the horn 7, and deterioration of the piezoelectric element 8 due to aging, when using the conventional apparatus shown in FIG. 12.

In addition, in the flip-chip bonding system described above, since the joined portion is hidden from view by the semiconductor chip 3, the joined portion cannot be visually inspected after the connection is made. Therefore, the occurrence of the defective joints can become a particularly serious problem.

SUMMARY OF THE INVENTION

The present invention has been devised to avoid such problems mentioned above, and its object is to provide a mounting method and a mounting apparatus for mounting an electronic part to a substrate conductor by means of the ultrasonic wave and thermocompression bonding connecting method utilizing the that flip-chip bonding system, while also being able to inspect the state of the formed joint, as was previously impossible with the conventional methods.

In order to achieve the above object, the present invention provides a first embodiment of a mounting apparatus of an electronic part utilizing ultrasonic wave and thermocompression bonding to form a flip-chip bonding system consisting of an ultrasonic vibration generating device, a horn attached to the ultrasonic vibration generating device, a collet tool for holding an electronic part attached to the horn, a control unit connected to the ultrasonic vibration generating device, a substrate conductor heating unit connected to the control unit, and a height measuring device, wherein the height measuring device for monitoring the height of the electronic part with respect to a substrate conductor is connected with the control unit.

In a second embodiment, a mounting method of an electronic part according to to the first embodiment is provided which includes lowering the electronic part having an electrode with respect to a substrate conductor having an electrode, applying a predetermined weight upon the electronic part when one or more bumps, which are provided on an electrode of the electronic part or an electrode of the substrate conductor, come into contact with a countered mating electrode, to compress the bumps and cause a first stage bump sinking amount, and then applying a predetermined weight and an ultrasonic vibration simultaneously on said electronic part for a predetermined time, to further compress the bumps, causing a second stage bump sinking amount, to form a connection between the electrode of the electronic part and the electrode of the substrate conductor.

The amount of compression of the bumps (bump sinking amount) due to application of the predetermined weight and an ultrasonic vibration for a predetermined time is monitored by a height measuring device, and the connection formed by ultrasonic wave and thermocompression bonding utilizing a flip-chip bonding system is judged defective or non-defective by making a judgment as to whether or not the bump sinking amount at the time of applying the ultrasonic vibration falls within a desired range.

In a third embodiment, a mounting method of an electronic part according to the second embodiment is provided, wherein the first stage bump sinking amount and second stage bump sinking amount are individually monitored by the height measuring device, and the connection formed by the ultrasonic wave and thermocompression bonding utilizing the flip-chip bonding system is judged defective or non-defective by making a judgment as to whether or not the respective stage bump sinking amounts fall within respective desired ranges.

In a fourth embodiment of the present invention, a mounting device of an electronic part having a bump for forming an ultrasonic wave and thermocompression bonding connection utilizing a flip-chip bonding system is provided consisting of an ultrasonic vibration generating device, a horn connected to the ultrasonic vibration generating device, a collet tool in connection with the horn, a control unit, and a substrate conductor heating unit in connection with the control unit, wherein a vibration measuring device for monitoring a vibrating state of the electronic part or the bump is connected with the control unit.

In a fifth embodiment of the present invention, a mounting method of an electronic part according to the fourth embodiment above, utilizing ultrasonic wave and thermocompression bonding methods in a flip-chip bonding system is provided for mounting the electronic part to a substrate conductor, wherein a vibrating state of the electronic part at the time of mounting is measured and compared with a reference waveform, a judgment made as to whether or not an ultrasonic vibration is applied normally and, using this information, the connection judged defective or non-defective.

In a sixth embodiment of the present invention, a mounting apparatus of an electronic part for forming an ultrasonic wave and thermocompression bonding connection utilizing a flip-chip bonding system is provided which consists of an ultrasonic vibration generating device, a horn connected to the ultrasonic vibration generating device, a collet tool attached to the horn, a control unit, and a substrate conductor heating unit connected with the control unit, wherein a measuring device for monitoring a voltage, an electric current, or both, to be applied to the ultrasonic vibration generating device, is connected with the control unit.

In a seventh and final embodiment of the present invention, a mounting method of an electronic part according to the sixth embodiment above, for forming an ultrasonic wave and thermocompression bonding connection utilizing a flip-chip bonding system, is provided, wherein a joint is inspected and judged defective or non-defective by applying and measuring a voltage and an electric current to an ultrasonic vibration generating device, and comparing the voltage and electric current, respectively, with reference waveforms to determine whether the voltage and electric current are applied normally in the mounting apparatus of an electronic part.

Specifically, while the defective or non-defective joint is compared with a reference, the mounting is performed by using means for monitoring a change (sinking amount) in the height of the bump present on the electronic part (ususally a semiconductor chip) at the time of the mounting, as described in the first, second and third embodiments described above, means for monitoring the vibrational state of the electronic part or bump at the time of the mounting, i.e., the amplitude, vibrating speed, vibrating velocity or the like as described in the fourth and fifth embodiment described above, and means for monitoring the voltage and electric current to be applied to the ultrasonic vibration generating device by utilizing a piezoelectric element as described in the sixth and seventh embodiment described above.

BRIEF DESCRIPTION OF THE DRAWINGS

FIG. 3($b$) illustrates the second step of the mounting process described herein, wherein a predetermined weight is applied to the semiconductor chip.

FIG. 3($c$) illustrates the third step of the mounting process described herein, wherein both a predetermined weight and ultrasonic vibrations are applied to the semiconductor chip.

FIG. 3($d$) illustrates the last stage of the mounting process described herein, wherein the semiconductor chip has been connected to a substrate conductor, and the collet tool is raised and separated from the semiconductor chip.

DETAILED DESCRIPTION OF THE INVENTION

Figure 1:
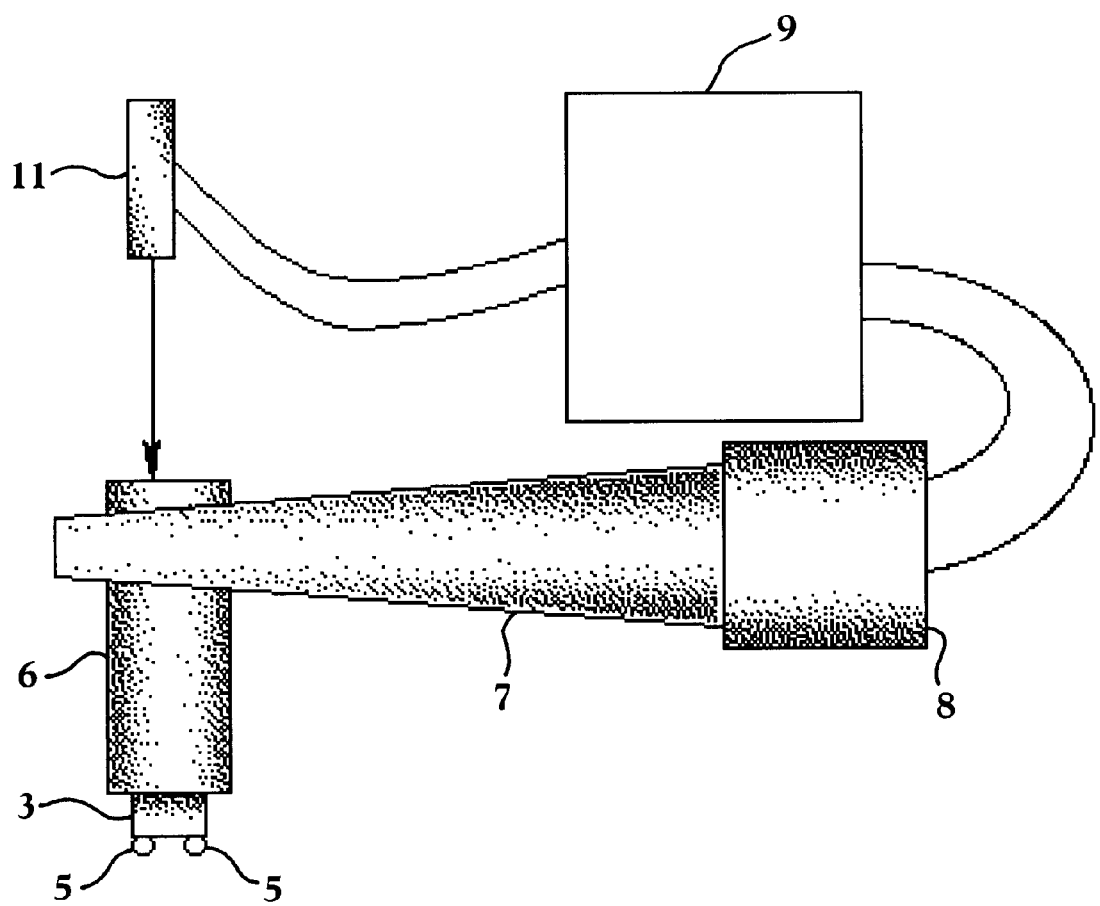
FIG. 1 is a system conceptual diagram of the mounting apparatus of an electronic part of the present invention according to claim 1 of the present invention.
Figure 2:
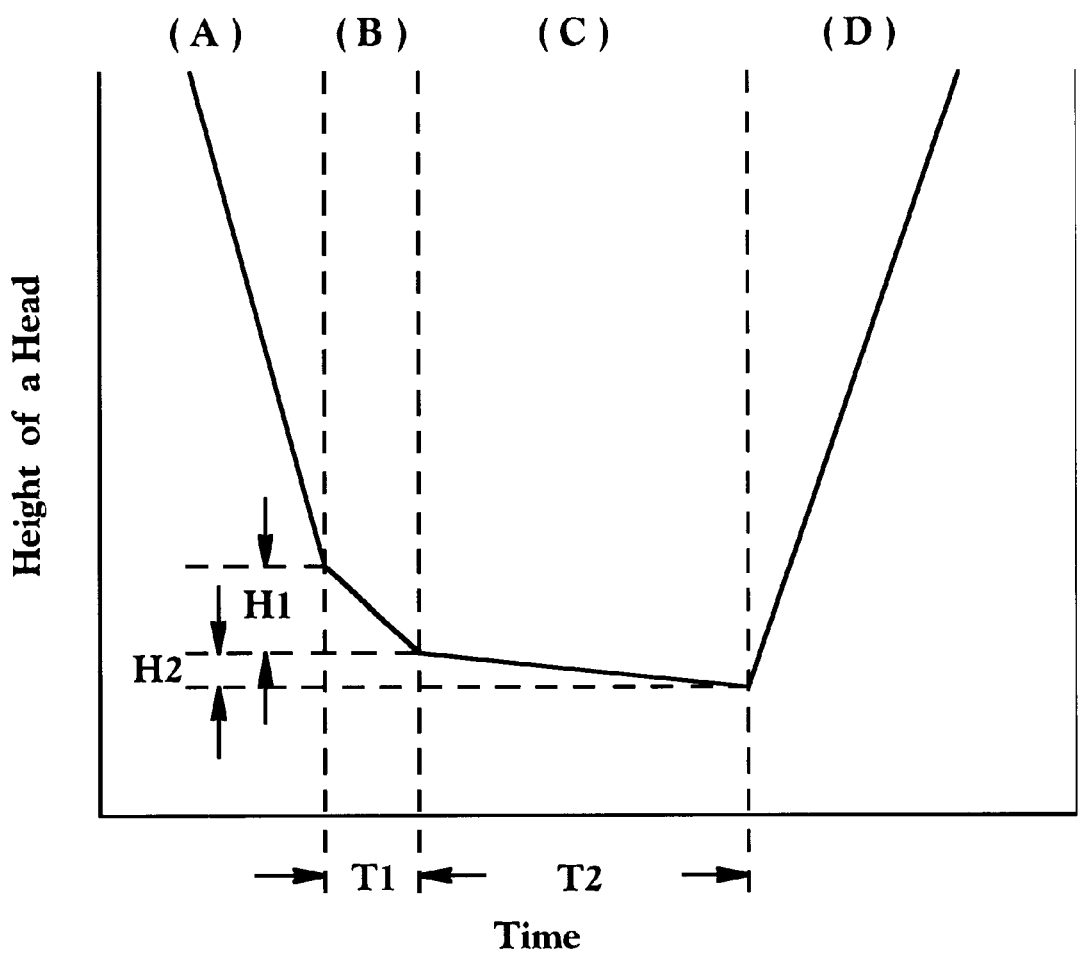
FIG. 2 is a graph showing the change in the height of a tool head of the present invention versus change in time (hourly).

In FIG. 1, a mounting apparatus 20 of an electronic part according to the present invention comprises an ultrasonic vibration generating device 8, a horn 7, a collet tool 6, a substrate conductor heating unit (not shown), a control unit 9, and a laser displacement meter 11 attached to the control unit which acts as a distance measuring device for monitoring the distance of the semiconductor chip 3 attached to the collet tool 6 with respect to a substrate conductor (not shown), the substrate conductor also being connected to the control unit 9.

Figure 3:
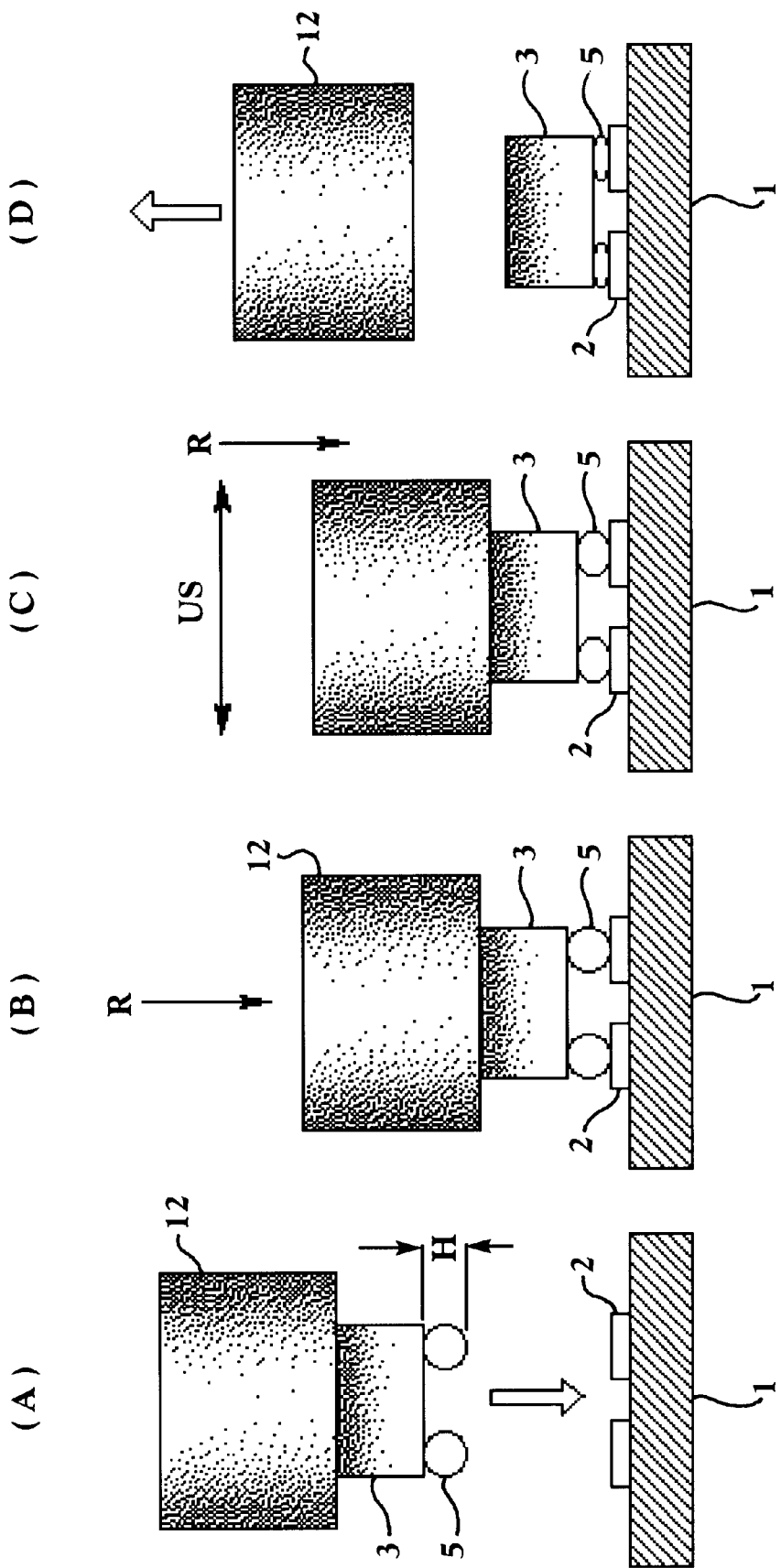
FIG. 3($a$) illustrates the position of the components of the present invention at the beginning of the mounting process of the semiconductor chip as described herein.

The semiconductor chip 3 is mounted to the substrate conductor by the mounting apparatus 20 according to the following steps:

First, as shown in FIG. 3($a$), the semiconductor chip 3 formed on an electrode is attached to the head 12 of the collet tool, and bumps or projections 5 formed in the semiconductor chip 3 having a height H=50 $\mu$m (for example Au bumps) are lowered so as to face electrodes 2 of the substrate conductor 1.

Second, as shown in FIG. 3($b$), just when the bumps 5 of the semiconductor chip 3 come into contact with the electrodes 2 of the substrate conductor 1, a predetermined weight R of about 0.1 to 200 grams/1 bamp, which is suitably set according to the material, shape, size, number and the like of the bumps 5 (normally several hundred gw to 1 kgw), is applied for generally about 10–10,000 msec. The application of weight R causes slight crushing and sinking of the bumps 5, into the electrodes 2. This weight is termed the first stage sinking amount H1.

Third, as shown in FIG. 3(c), the predetermined weight R and an ultrasonic vibration US (lateral vibration) are applied for a predetermined time T2, generally about 50–10,000 msec, so that the electrode of the semiconductor chip 3 is joined to the electrodes 2 of the substrate conductor 1 by ultrasonic wave and thermocompression bonding of the bumps 5.

Fourth, as shown in FIG. 3(d), the head 12 of the collet tool is separated from the semiconductor chip 3 so as to rise, and the sinking amount of the bumps 5, termed the second stage sinking amount H2, caused by the application of the predetermined weight R and ultrasonic vibration US, is monitored by the laser displacement meter 11 (distance measuring device) shown in FIG. 1, and a judgment is made as to whether or not the sinking amount H2 of the bumps 5 is in a desired range. Specifically, a judgment is made as to whether the joint obtained by the ultrasonic wave and thermocompression bonding connection utilizing the flip-chip bonding system is defective or non-defective.

Figure 4:
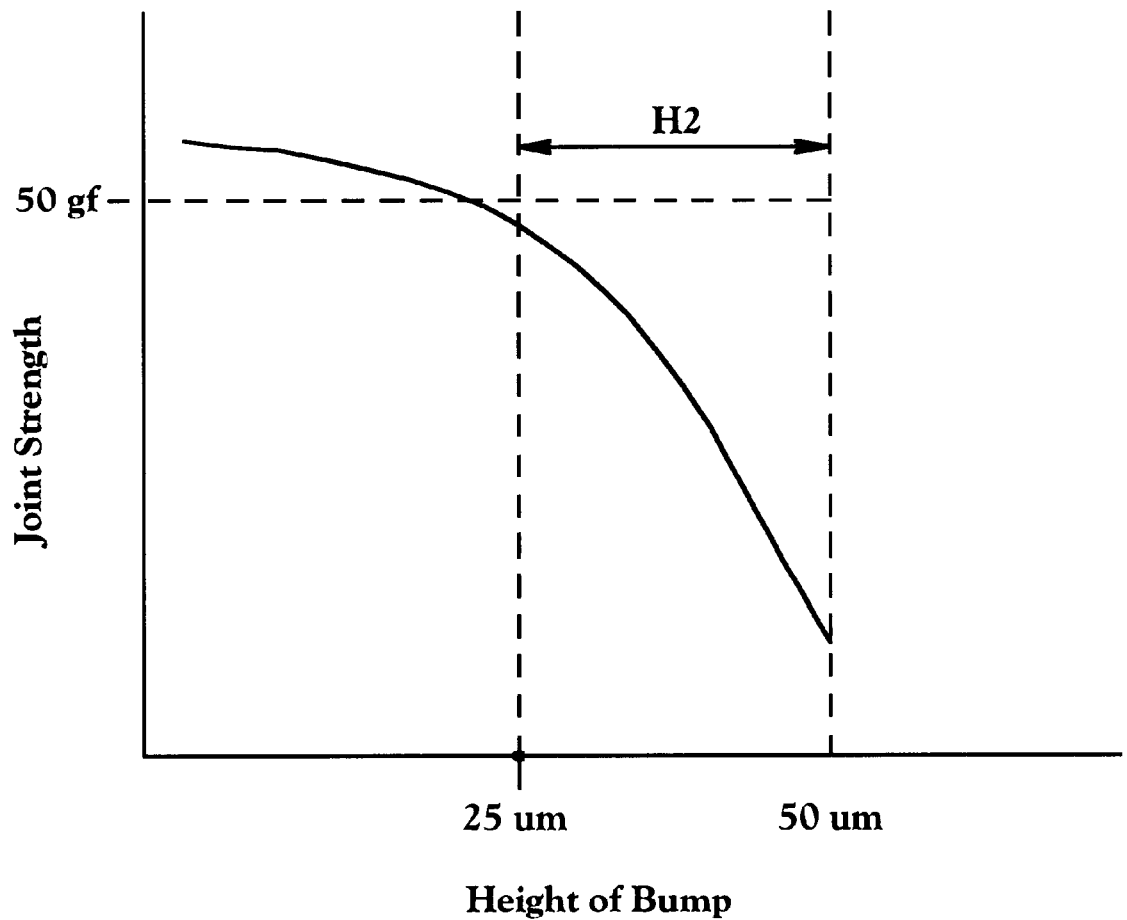
FIG. 4 is a graph showing the relationship of joint strength between a bump formed of Au and electrodes of a substrate conductor and height of the bump.

It was experimentally determined that the amount of compression, i.e., the sinking amount H2, of the bumps 5 at the second height stage as shown in FIG. 3(d) (in other words, the change in distance between the semiconductor chip 3 and the substrate conductor due to the crushing of the bumps 5 when the predetermined weight R and the ultrasonic vibration US are applied) and the joint strength between the electrode of the semiconductor chip 3 and the electrodes 2 of the substrate conductor 1 by means of the bumps 5 satisfy a graphical relationship, as shown in FIG. 4.

In thermosonic bonding, an almost uniform bonding is effected at a boundary between a semiconductor electrode and a bump. A bonding strength for each unit area is determined by the materials the semiconductor electrode and the bump are made of. It can be said that if strengths are equal, then bonding areas are equal. Furthermore, if a bump is compressed by a load and ultrasonic vibration, the bonding area is increased.

Accordingly, if shapes of bumps are equal to each other, the compression of the bumps, that is the sinking amounts thereof, and bonding areas are uniquely determined. And if bonding areas are equal to each other, then bonding strengths are also equal to each other. Hence, inspection of the joint formed between the semiconductor chip and the substrate conductor can be performed by measuring the amount of compression of the bump (the sinking amount).

Therefore, for example, a standard of judgment is previously set so that when the joint connection between the bumps (Au bumps) 5 and the electrodes 2 is not less than 50 gw, the joint is non-defective, and when smaller than 50 gw, the joint is defective. When the sinking amount H2 at the second stage, as shown in FIG. 3(c), is not less than 25 µm, the joint is defective. A judgment is made by the control unit 9 as to whether the joint is defective or non-defective based on monitored data from the laser displacement meter 11, also referred to herein as the distance measuring device.

According to the above method, since a product whose joint strength is not more than 25 gw is defective, it is treated as a defective product or, if the desired sinking amount H2 can be obtained by again applying a ultrasonic wave, a non-defective joint can be produced. Therefore, a defective joint formed on the first attempt does not necessarily influence production steps thereafter, and yield of non-defective products can be improved.

As mentioned above, the mounting method is a method for monitoring only the sinking amount H2 at the second stage of the method of the present invention, as shown in FIG. 3(c), and may be enough to judge whether the joint is defective or non-defective. However, in order to judge the defectiveness or non-defectiveness of the joint more accurately, it is desired to also monitor the sinking amount H1 at the first stage of the process, as shown in FIG. 3(b), and use both the sinking amount H1 at the first stage and the sinking amount H2 at the second stage as data for judging the defectiveness or non-defectiveness of the joint.

Therefore, in the above-described mounting method, the sinking amount H1 of the bumps at the first stage, where the predetermined weight R of about 0.1 to 200 grams/1 bamp is applied for the predetermined time T1 (generally about 10–10,000 msec, but usually predetermined on the order of 100 msec) just when the bumps 5 come into contact with the mating electrodes 2, and the sinking amount H2 of the bumps at the second stage, where in addition to the application of predetermined weight R, ultrasonic vibration US is applied for the predetermined time T2 (generally about 50 to 10,000, but usually predetermined in the range of about 1000 to 2000 msec) are individually monitored by the laser displacement meter 11 acting as a distance measuring device. These measurements allow a judgment to be made by the control unit 9 as to whether or not the sinking amounts H1 and H2 of the bumps at the above stage, are respectively, in predetermined desired ranges, so that a determination may be made as to whether or not the joint between the semiconductor chip 3 and the substrate conductor 1 by the ultrasonic wave and thermocompression bonding connection utilizing the flip-chip bonding system is defective or non-defective.

According to the above described mounting method, in the case where the sinking amount H1 of the bumps 5 at the stage of the process shown in FIG. 3(b), at the time when the predetermined weight R is applied for the predetermined time T1, deviates from a range of set values, the bumps are deemed abnormal, and slipping of the bumps may occur. For this reason, a judgment can be made at a stage before the joint is made as to whether the bumps are defective or non-defective. To make such a judgment, when the sinking amount H1 at the first stage and the sinking amount H2 at the second stage are separately monitored and evaluated, the defectiveness or non-defectiveness of the joint can be judged with a high degree of accuracy.

Here, as the distance measuring device for successively monitoring the height of the head 12, i.e., monitoring the sinking amounts H1 and H2 in the above embodiment, devices other than the laser displacement meter 11 may be used. For example, a counter for counting a pulse number of a pulse motor may be used.

Figure 5:
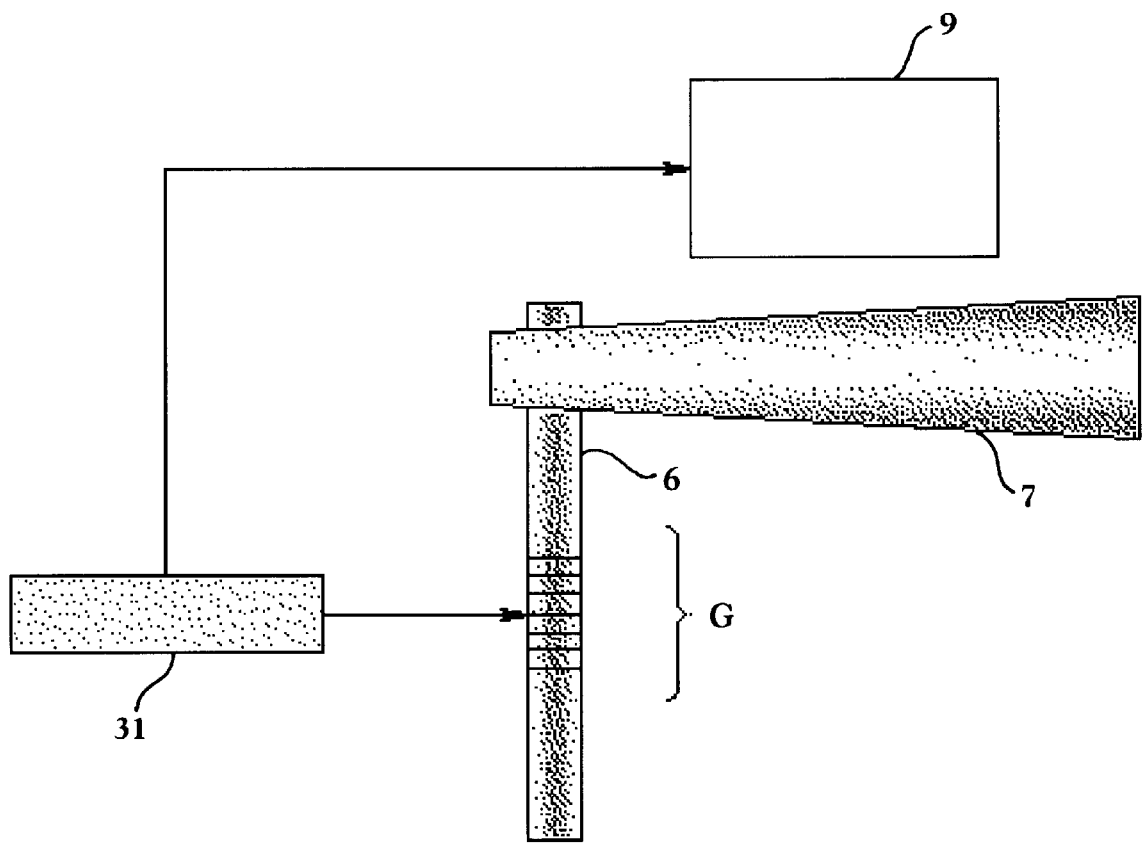
FIG. 5 is a system conceptual diagram showing the mounting apparatus of an electronic part having means for detecting the amount of compression (sinking amount) of the bumps by means of grids.

In addition, as the distance measuring means, as shown in FIG. 5, grids G as degrees are formed on a side surface of the collet tool 6, which retains the electronic part and is joined to the substrate conductor in every 1 µm, and the number of grids passing a grid sensor 31 during application of the ultrasonic vibration US are counted by a light, laser or the like based on the time when the semiconductor chip 3 on the head of the forward end of the collet tool comes in contact with the bumps, so that the sinking amount H2 of the chip at the second stage can be obtained. The grids G may be formed by a magnetic material and, if so, the counting may be executed by a magnetic sensor. The grids may also be provided on the forward end of the horn 7.

Figure 6:
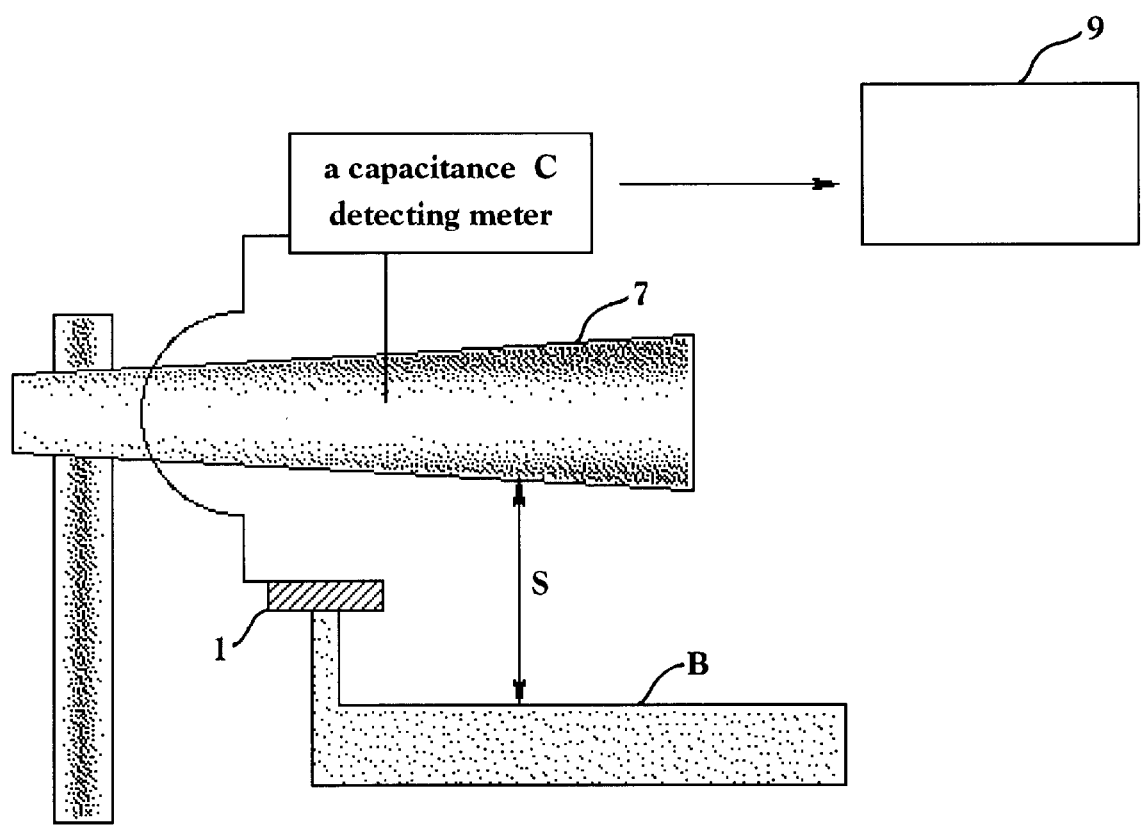
FIG. 6 is a system conceptual diagram showing the mounting apparatus of an electronic part having means for detecting a sinking amount by means of a change in capacitance.

Further, as another means for measuring the distance of the head with respect to the substrate conductor, measuring means utilizing measurement of capacitance may be used. For instance, as shown in FIG. 6, a flat type electrode B may be provided 1 mm below the bottom dead center of the horn 7, and capacitance C between the flat type electrode B and the horn 7, which is made of metal, is measured. Since the capacitance C is determined by the distance S between the horn 7 and the flat electrode B, the sinking amount of the semiconductor chip 3 is detected by measuring the capacitance C by a capacitance detecting meter. This measurement of capacitance allows judgement of the defectiveness or non-defectiveness of the joint.

In addition, instead of the flat type electrode B, a coil horn can be directly mounted as the horn 7, and the distance between the coil horn and the substrate conductor can be obtained by an inductance component of the coil horn.

Figure 7:
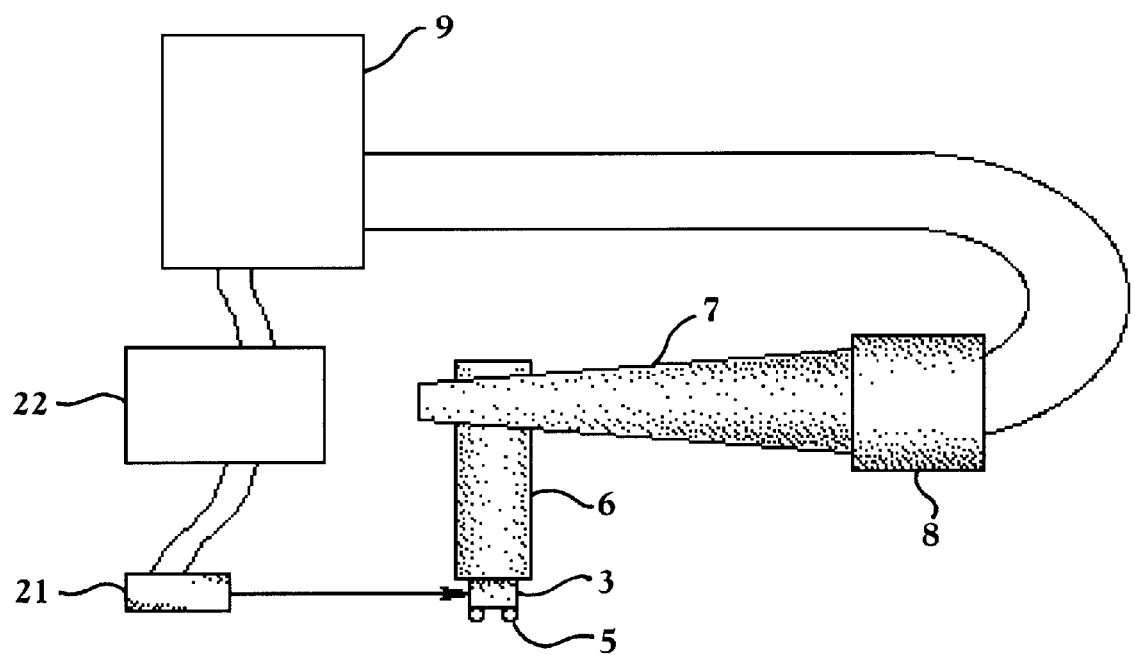
FIG. 7 is a system conceptual diagram showing the mounting apparatus according to the present invention.
Figure 8:
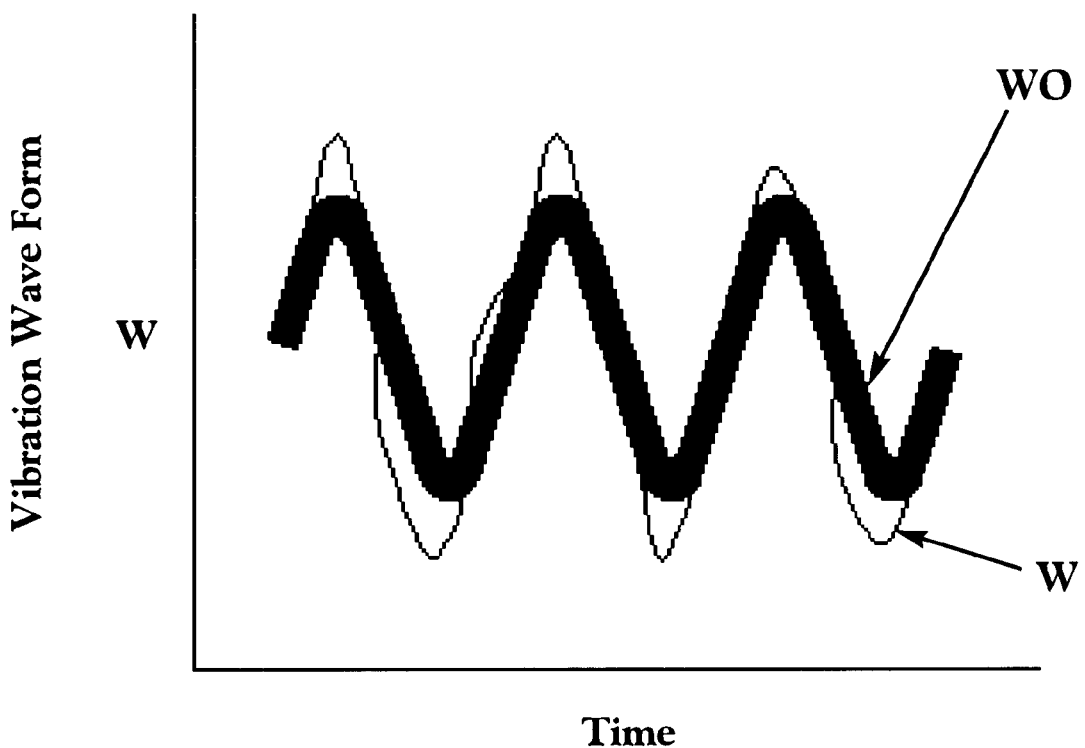
FIG. 8 is a graph comparing vibration waveform W and preset reference waveform W0 versus time.
Figure 12:
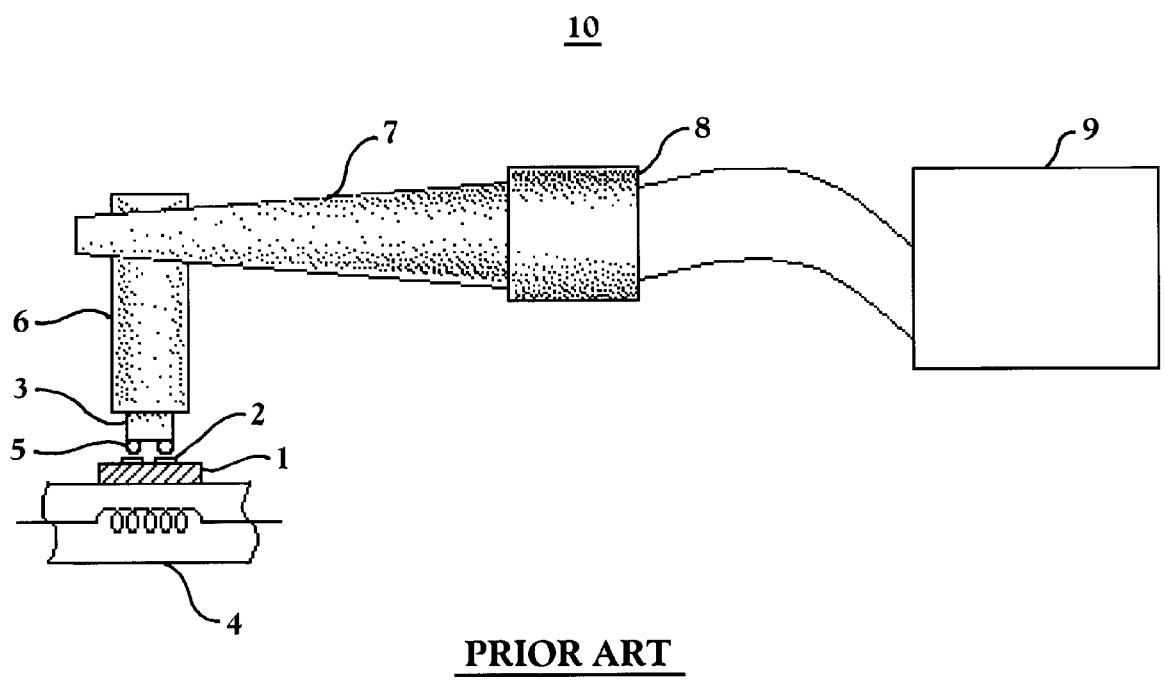
FIG. 12 is a system conceptual diagram showing a conventional mounting apparatus according to an ultrasonic wave and thermocompression bonding connection utilizing a flip-chip bonding system.

Mounting apparatus 30, as shown in FIG. 7, includes, in addition to the components of the conventional mounting apparatus 10 shown in FIG. 12, a vibration measuring device 21 for monitoring a vibrating state of the semiconductor chip 3 or the bumps 5, which is connected with the control unit 9 of the electronic part. In the mounting apparatus 30, a vibration waveform W, for example, of the semiconductor chip 3 at the time of the mounting is measured and it is compared with a preset reference waveform W0, as shown in FIG. 8, and the joint is inspected to determine whether it is defective or non-defective by making a judgment as to whether or not the ultrasonic vibration US is applied normally.

Since the vibration waveform generated by the ultrasonic vibration US of the semiconductor chip 3 and the bumps 5 changes constantly in the joint steps, a judgment as to whether or not the ultrasonic vibration US is normally applied to the joint portion can be made by a monitoring any deviation of the vibration waveform W from the reference vibration waveform W0.

In other words, it is an object of one embodiment of the invention to measure the vibration waveform W when monitoring the vibrating state, and a laser Doppler vibration meter 22 is provided as the vibration measuring device 21. A laser beam of the laser Doppler vibration meter 22 is directed at the semiconductor chip 3, and the vibrating state of the semiconductor chip 3 at the time of the mounting (amplitude and vibrating speed) is monitored as a waveform. The obtained vibration waveform W is compared with the reference waveform W0 by the control unit 9, so that a judgment can be made as to whether or not the ultrasonic vibration US is normally applied to the bumps 5, and when the vibration waveform W deviates from the allowable range of the reference waveform W0, the joint is deemed defective.

Figure 9:
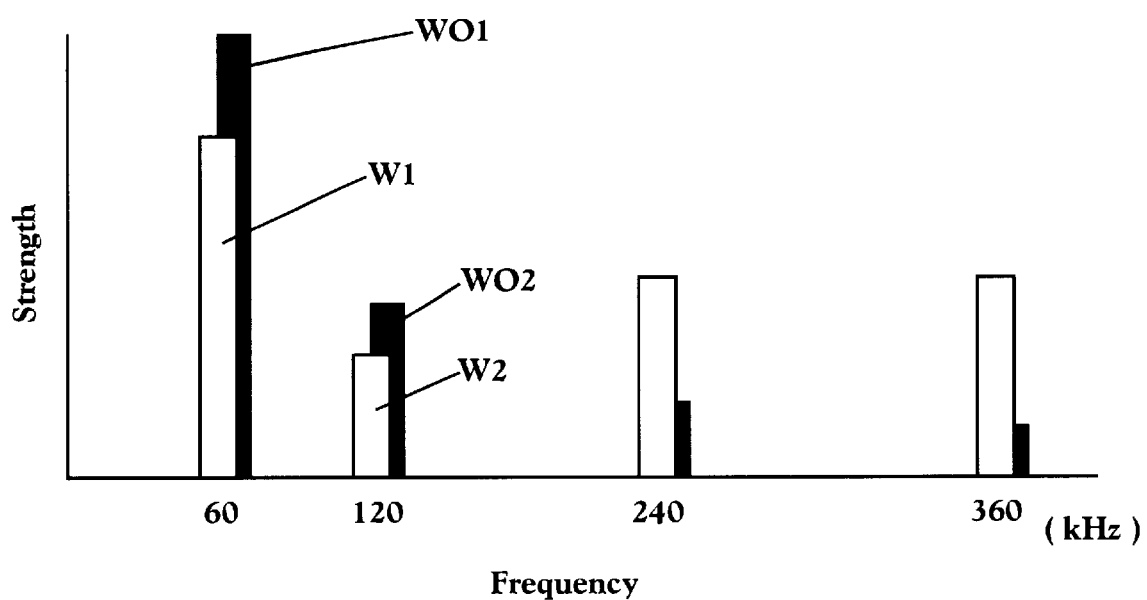
FIG. 9 is a graph showing that the vibration waveform W is decomposed according to frequency, and its respective spectrums are compared with corresponding reference wave spectrums of the reference waveform W0.

At the time of this judgment, as shown in FIG. 9, the vibration waveform W is decomposed according to frequency by FFT (fast Fourier transform), and spectrums W1 and W2 are respectively compared with corresponding reference wave spectrums W01 and W02 of the reference waveform W0 so that a comparison and judgment can be quantitatively made.

Figure 10:
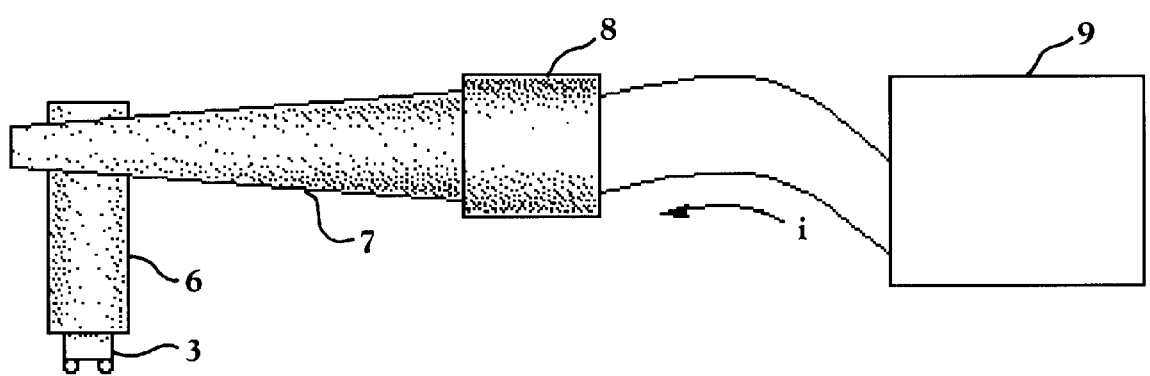
FIG. 10 is a system conceptual diagram showing the mounting apparatus of an electronic part according to the present invention.

Mounting apparatus 40, shown in FIG. 10, includes, in addition to the components of the conventional mounting apparatus 10 shown in FIG. 12, a measuring device for monitoring an electric current i applied to the ultrasonic vibration generating device (piezoelectric element) 8, which is connected to the control unit 9, so as to be positioned therein. A waveform of the measured electric current i is compared with a preset reference electric current waveform i0 as shown in FIG. 11, and the bump is inspected and judged to be defective or non-defective by making a judgment as to whether or not the ultrasonic vibration US is applied normally to the bumps 5.

Figure 11:
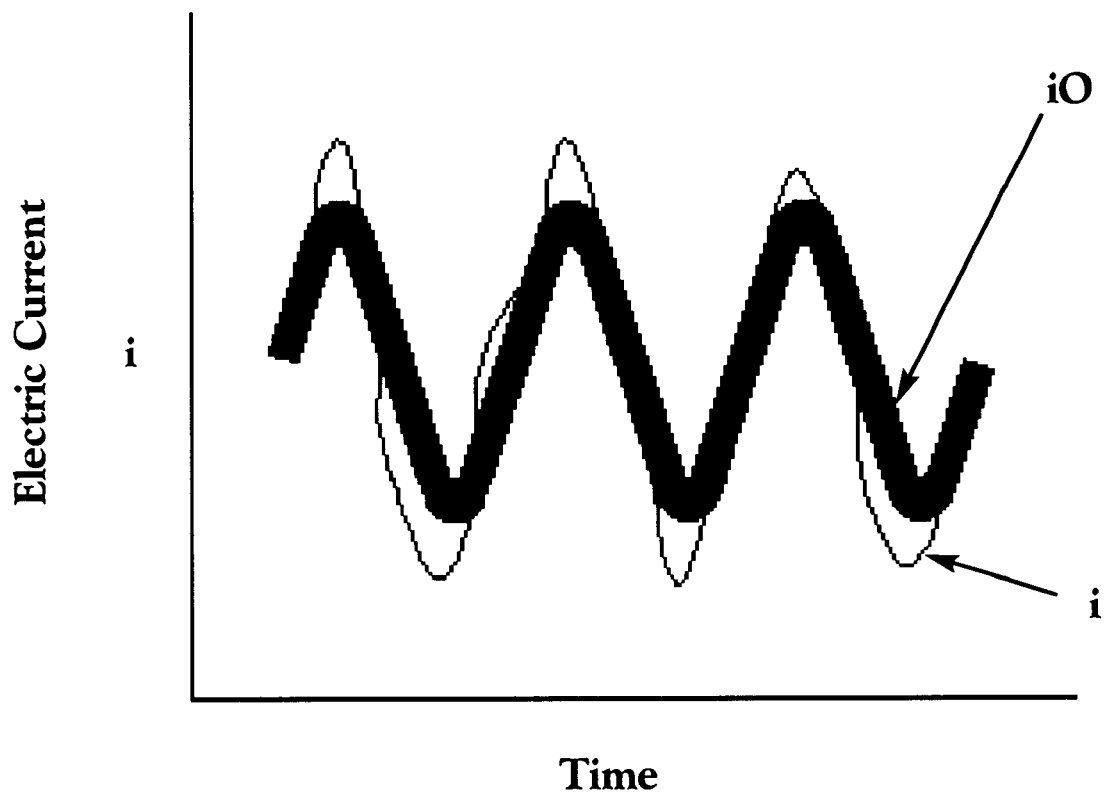
FIG. 11 is a graph comparing a monitored waveform of an electric current i applied to a piezoelectric element and a reference electric current waveform iO versus time.

As can be seen in FIG. 11, since the electric current i to be applied to the piezoelectric element by the ultrasonic vibration generating device 8 changes constantly in the joint forming steps, a judgment can be made as to whether or not the ultrasonic vibration US is applied normally by monitoring any deviation of the corresponding waveform i from a reference electric current waveform io.

When an electric current probe using a hole element is used as the measuring device for monitoring the electric current i flowing in the ultrasonic vibration generating device (piezoelectric element) 8, a noise present at the time of measurement can be reduced, and the measuring accuracy may be improved.

When the waveform of the electric current i is compared with the reference electric current waveform iO as shown in FIG. 11 (analysis of spectrums by means of FFT), it can be determined whether or not the ultrasonic vibration US is normally applied to the bumps 5, and when the waveform of the electric current i deviates from the allowable range of the reference electric current waveform i0, the joint is deemed defective.

In addition, a voltage V may be applied to a piezoelectric crystal element, as described above using an electric current i, and the change in the voltage measured to determine the waveform. Then, this waveform can be compared with a reference waveform, as described above with an electric current i.

The aforementioned embodiments referred to the case where the bumps 5 are provided on the electrode side of the semiconductor chip 3, but the same conditions also apply to the case where the bumps 5 are provided on the electrode 2 side of the substrate conductor 1.

In addition, the aforementioned embodiments referred mainly to the mounting of semiconductor chips onto substrates but, needless to say, it can be applied to all electronic parts which can be flip-chip bonded by the ultrasonic wave and thermocompression bonding method.

As is clear from the above detailed embodiments, in the mounting method and mounting apparatus of the electronic part according to the present invention, since when the mounting height, vibrational state and electric current of the ultrasonic vibration generating device (piezoelectric element) are monitored and compared with the reference values and reference waveforms, a judgment can be made as to whether or not the joint state and ultrasonic vibrating state of the electronic part by means of the bumps are normal simultaneously with the mounting. If any abnormality is measured or detected, the following countermeasures may be taken:

(a) the mounting apparatus is immediately stopped and the abnormality is identified;

(b) the product is marked as defective;

(c) an ultrasonic wave is again applied and the product is reproduced; and (d) an ultrasonic wave is continually applied until the desired state is obtained.

As a result, the above mounting method and mounting apparatus have the desirable quality in that the joint can be judged as defective or non-defective, and the product can be reproduced.

What is claimed is:

1. A mounting apparatus of a flip-chip having a plurality of bonding areas said bonding areas constituting bumps, utilizing ultrasonic wave and thermocompression bonding to form a flip-chip bonding system which monitors the connection of a plurality of bonding areas on said flip-chip to assure a non-defective bond thereof comprising:

an ultrasonic vibration generating device;

a horn attached to the ultrasonic vibration generating device;

a collet tool for holding a flip-chip attached to said horn;

a control unit being connected to the ultrasonic vibration generating device;

a substrate conductor heating unit connected to said control unit;

a height measuring device for monitoring a height of the flip-chip with respect to a substrate conductor connected to the control unit, by monitoring a first bump sinking amount and a second bump sinking amount of a flip-chip having a plurality of bumps thereon; and a vibration measuring device for monitoring a vibrating state of a plurality of bonding areas of the flip-chip connected with said control unit;

wherein the control unit controls operation of the ultrasonic vibration generating device based on change in height between the flip-chip and the substrate conductor heating unit and on the vibrating state of the plurality of bonding areas of the flip-chip.

2. A mounting apparatus for mounting a flip-chip having a plurality of bumps constituting bonding areas on a substrate using ultrasonic wave and thermocompression bonding utilizing a flip-chip bonding system which monitors the connection of a plurality of bonding areas of a flip-chip to assure a non-defective bond thereof comprising:

an ultrasonic vibration generating device;

a horn connected to said ultrasonic vibration generating device;

a collet tool attached to said horn;

a control;

a substrate conductor heating unit connected with said control unit; and a measuring device for monitoring a voltage, an electric current, or both, to be applied to the ultrasonic vibration generating device, connected with said control unit, which monitors the condition of a plurality of bumps of the flip-chip during the bonding process, wherein the formed plurality of ultrasonic and thermocompression bonding connections are inspected and judged defective or non-defective by applying and measuring a voltage, an electric current, or both to the ultrasonic vibration generating device, and then comparing the measured voltage, electric current, or both, with reference waveforms to determine whether the voltage of electric current are applied normally in the mounting apparatus.

* * * * *